US010310144B2

United States Patent
Ahmed et al.

(10) Patent No.: US 10,310,144 B2
(45) Date of Patent: Jun. 4, 2019

(54) IMAGE SENSOR HAVING PHOTODETECTORS WITH REDUCED REFLECTIONS

(71) Applicant: Intel Corporation, Santa Clara, CA (US)

(72) Inventors: Khaled Ahmed, Anaheim, CA (US); Richmond Hicks, Beaverton, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/178,271

(22) Filed: Jun. 9, 2016

(65) Prior Publication Data
US 2017/0357031 A1    Dec. 14, 2017

(51) Int. Cl.
G02B 3/00 (2006.01)
G02B 1/118 (2015.01)
H04N 5/225 (2006.01)
H01L 27/146 (2006.01)

(52) U.S. Cl.
CPC .......... G02B 1/118 (2013.01); H01L 27/1462 (2013.01); H01L 27/14627 (2013.01); H04N 5/2253 (2013.01); G02B 3/0056 (2013.01)

(58) Field of Classification Search
CPC .. G02B 1/118; G02B 1/11; G02B 1/14; G02B 3/0018; G02B 3/0062; H01L 27/14627; H04N 5/2254
See application file for complete search history.

(56) References Cited

U.S. PATENT DOCUMENTS

| | | | |
|---|---|---|---|
| 2002/0135869 A1* | 9/2002 | Banish | G02B 1/11 359/350 |
| 2003/0112523 A1* | 6/2003 | Daniell | G02B 3/005 359/626 |
| 2005/0236553 A1* | 10/2005 | Noto | H01L 27/14621 250/208.1 |
| 2008/0055728 A1* | 3/2008 | Tanaka | G02B 1/118 359/584 |
| 2008/0107993 A1* | 5/2008 | Wolk | B41M 5/38214 430/200 |
| 2008/0265149 A1* | 10/2008 | Endoh | G02B 1/118 250/237 R |
| 2008/0291303 A1* | 11/2008 | Onozawa | G02B 5/1885 348/294 |
| 2008/0304155 A1* | 12/2008 | Endoh | G02B 1/118 359/558 |
| 2010/0135043 A1* | 6/2010 | Wang | G02B 6/0016 362/628 |

(Continued)

OTHER PUBLICATIONS

L. Rayleigh, "On Reflection of Vibrations at the Confines of two Media between which the Transition is Gradual," Proceedings of the London Mathematical Society 1879, 1 (1), 51-56.

(Continued)

*Primary Examiner* — Chia Wei A Chen
(74) *Attorney, Agent, or Firm* — Womble Bond Dickinson (US) LLP (57) ABSTRACT

An image sensor is described that has photodetectors with reduced reflections. In one example the image sensor has a plurality of photodetectors on a silicon substrate. The images sensor has a top surface and an anti-reflective coating over the photodetectors, the coating having an array of sub-wavelength sized features.

20 Claims, 5 Drawing Sheets

(56) References Cited

U.S. PATENT DOCUMENTS

| | | | |
|---|---|---|---|
| 2010/0244169 A1* | 9/2010 | Maeda | G02B 1/118 257/432 |
| 2010/0321684 A1* | 12/2010 | Bratkovski | G01N 21/658 356/301 |
| 2011/0228266 A1* | 9/2011 | Kuo | B82Y 20/00 356/301 |
| 2012/0013989 A1* | 1/2012 | Choi | B82Y 20/00 359/642 |
| 2012/0069181 A1* | 3/2012 | Xue | G01J 3/0229 348/148 |
| 2012/0113419 A1* | 5/2012 | Wang | B82Y 15/00 356/301 |
| 2012/0243097 A1* | 9/2012 | Hayashibe | G02B 1/118 359/599 |
| 2012/0268822 A1* | 10/2012 | Law | G02B 1/12 359/580 |
| 2012/0318342 A1* | 12/2012 | Dimitrakopoulos | G06F 3/061 136/256 |
| 2013/0027557 A1* | 1/2013 | Hirai | B60S 1/0844 348/148 |
| 2013/0161777 A1* | 6/2013 | Adkisson | H01L 24/05 257/437 |
| 2013/0244005 A1* | 9/2013 | Hsu | G02B 1/11 428/161 |
| 2013/0295772 A1* | 11/2013 | Kim | H01L 21/308 438/694 |
| 2014/0072830 A1* | 3/2014 | Lille | G11B 5/855 428/847 |
| 2014/0146207 A1* | 5/2014 | Yokogawa | H04N 5/374 348/281 |
| 2015/0091137 A1* | 4/2015 | Hendricks | H01L 21/0273 257/618 |
| 2015/0205197 A1* | 7/2015 | Finders | G03F 7/0002 355/18 |
| 2015/0207957 A1* | 7/2015 | Lee | G06F 3/1208 358/452 |
| 2015/0243525 A1* | 8/2015 | Park | H01L 21/31144 438/703 |
| 2015/0287756 A1* | 10/2015 | Ezoe | C09D 7/12 257/432 |
| 2016/0210397 A1* | 7/2016 | Laenens | G03F 1/36 |
| 2016/0238741 A1* | 8/2016 | Chang | G02B 3/0056 |
| 2016/0293197 A1* | 10/2016 | Bromberg | G11B 5/7315 |
| 2016/0370505 A1* | 12/2016 | Koo | G02B 1/118 |

OTHER PUBLICATIONS

S. J. Wilson, et al., "The Optical Properties of 'Moth Eye' Antireflection Surfaces," Opt. Acta, vol. 29, pp. 993-1009, 1982.

D. G. Stavenga, et al., "Light on the moth-eye corneal nipple array of butterflies," Proc. R. Soc. London Ser. B 2006, 273, 661-667.

Young Min Song, et al., "Bioinspired Parabola Subwavelength Structures for Improved Broadband Antireflection," Small 2010, 6, No. 9, 984-987.

S. Hava, et al., "Operator approach to electromagnetic coupled-wave calculations of lamellar gratings: infrared optical properties of intrinsic silicon gratings," Appl. Opt. 33(21), 4807-4813 (1994).

M. Auslender, et al., "One-dimensional antireflection gratings in (100) silicon: a numerical study," Appl. Opt. 37(2), 369-373 (1998).

S. Hava, et al., "Reflection of infrared radiation from lamellar gratings on a silicon wafer," J. Appl. Phys. 85(11), 7893-7898 (1999).

P. Lalanne, et al., "Design, fabrication, and characterization of subwavelength periodic structures for semiconductor anti-reflection coating in the visible domain," Proc. SPIE, vol. 2776, pp. 300-309, 1996.

S. H. Zaidi, et al., "Optical properties of nanoscale, one-dimensional silicon grating structures." J. Appl. Phys., v. 80, pp. 6997-7008, Dec. 1996.

J. F. Young, et al., "Laser-induced periodic surface structure. II. Experiments on Ge, Si, Al, and brass," Phys. Rev. B 27(2), 1155-1172 (1983).

F. Costache, et al., "Sub-damage-threshold femtosecond laster ablation from crystallin Si: surface nanostructures and phase transformation," Appl. Phys., A Mater. Sci. Process. 79(4-6), 1429-1432 (2004).

R. Le Harzic, et al., "Sub-100 nm nanostructuring of silicon by ultrashort laser pulses," Opt. Express 13(17), 6651-6656 (2005).

J. Bonse, et al., "On the role of surface plasmon polaritons in the formation of laser-induced periodic surface structures upon irradiation of silicon by femtosecond laser pulses," J. Appl. Phys. 106(10), 104910-1-5 (2009).

G. A. Martsinovsky, et al., "Generation of Surface Electromagnetic Waves in Semiconductors under the Action of Femtosecond Laser Pulses," Semiconductors 43(10), 1298-1304 (2009).

* cited by examiner

IMAGE SENSOR HAVING PHOTODETECTORS WITH REDUCED REFLECTIONS

FIELD

The present description relates to the field of image sensors for near infrared and, in particular, to an image sensor with reduced reflection.

BACKGROUND

Small image sensors continue to improve in cost and performance and have become ubiquitous in smart phones, notebook computers, tablets and many other devices. At the same new device types such as headsets, glasses, dashboard cameras, and autonomous vehicles continue to emerge. The common CMOS (Complementary Metal Oxide Semiconductor) image sensor that is used in most digital cameras has an array of photodetectors. Usually there is one photodetector for each pixel. The sensor is well suited to capture and measure visible light.

The same sensor is also able to capture and measure NIR (Near Infrared) light. As a result, new applications are being developed to exploit this property. Biometric authentication and depth cameras, for example have been developed to use NIR. NIR has a benefit of revealing features that are not visible in visible light. Such features may reflect NIR but not visible light or the system may incorporate invisible, NIR illumination that does not distract or otherwise influence the user.

Every image sensor technology that relies on incident photons must be of a certain size in order to capture enough photons to make an accurate measurement. A smaller sensor captures fewer photons because fewer photons strike the smaller area. A larger sensor is more accurate but it requires more volume for housing and is more expensive to make. A further limitation of sensors comes in quantum efficiency. As the size of the pixel approaches the wavelength of the light being detected, the response of a CMOS pixel diminishes.

The loss of quantum efficiency may be compensated for by increasing illumination of the scene with a lamp or flash, increasing the collection or exposure time, or using faster or brighter optics to focus the light.

The light collection efficiency of a CMOS silicon photodetector also suffers from a relatively high reflection of photons at the air-silicon interface from the ambient into the sensor. This is because the refractive index of air is very different from that of silicon. Flat silicon surfaces have a light reflectivity in air of 35-40%. This may be compensated for by using antireflection coatings on the sensor.

Transparent quarter wavelength layers of SiOx, TiOx, or SixNy with intermediate or gradient refractive indices work well as antireflection (AR) coatings. AR coatings may be formed by single or multiple layer film deposition through various processes such as plasma enhanced chemical vapor deposition and sputtering. These coatings have resonant structures and work very well within the designed spectral range and angles of incidence. Some also provide hardness to protect the underlying sensor and electronics.

BRIEF DESCRIPTION OF THE DRAWING FIGURES

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity.

DETAILED DESCRIPTION

As described herein sub-wavelength structures may be used instead of a thin film interference filter to reduce reflection from the first surface of an image sensor. The use of sub-wavelength features enables their application to smaller pixels as a relatively large number of features may be applied to each pixel ensuring uniform performance of the anti-reflection features. The sub-wavelength features may act as a graded index matching transition between two materials. Without the graded transition the hard transition between the two materials would otherwise cause the reflection. The sub-wavelength structures may be applied to the surface of an image sensor. The dimensions of the features may be tuned to reduce the surface reflectivity for the desired wavelengths, i.e. the wavelengths that are to be passed by the coating through to a photosite. By reducing surface reflection, the additional transmitted energy may be coupled into the photosites of the imager improving the effective quantum efficiency of the imager.

Sub-wavelength structures may be fabricated using block copolymer self-assembly and silicon plasma etching. This can create a highly regular silicon surface nano-texture, with precise control over the texture's lateral feature size. The features may be created with a vertical profile and a feature density in a range of 10-100 nm The described sub-wavelength structures improve the quantum efficiency in the NIR wavelengths for Si based sensors using structures that are compatible with <2.0 um pixels. Efficiency improves when the structures are used to manage the surface reflections at interfaces that include a significant change in the index of refraction.

Figure 1:
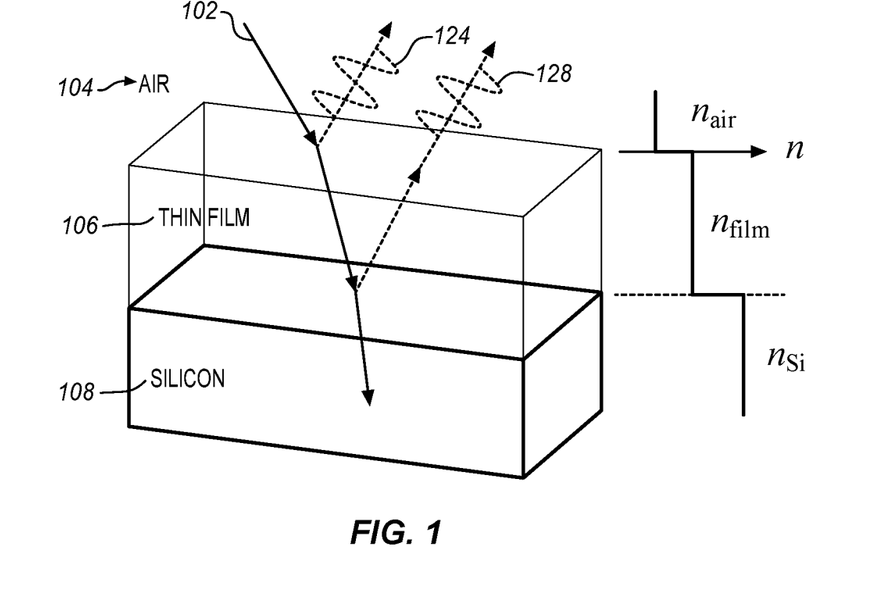
FIG. 1 is a diagram of a silicon block with an anti-reflection coating.

The light collection efficiency of any type of silicon-based image sensor may be enhanced using a gradient or gradual transition between the air and the silicon. Reducing the reflected light improves the performance of light sensors for collecting light from visible wavelengths into the NIR. FIG. 1 is a diagram of a silicon block 108 with a thin film anti-reflection coating 106 in air 102 to show an example of typical reflection that occurs with a thin film over the silicon as analyzed by the equations developed by Augustin-Jean Fresnel to express a law from Willebrord Snell.

Light 102 that has an incident angle to a normal to the thin film coating is partially transmitted as it hits the transition from air 104 to the thin film 106. A portion 122 is transmitted through the film and a portion 124 is reflected. Similarly when the transmitted portion 122 hits the transition to the silicon 108, then a portion of that light is transmitted 126 and another portion is reflected 128. Snell's law determines the reflection angles based on the incident angles and Fresnel's equations determine the reflection coefficients based on the angles and the relative indices of refraction. By using multiple layers with different indices of refraction between that of the air and the silicon and by carefully selecting the thickness of each layer, the amount of reflection can be greatly reduced for light within any particular narrow range of wavelengths.

As shown in the right side diagram the air has one index of refraction $n_{air}$. The silicon block has another index of refraction $n_{Si}$ and the thin film has an index of refraction $n_{film}$ which is between the two. There is a sharp transition between each material. In this diagram the silicon represents the typical material for the photodetector of a pixel of an image sensor. Incident light that penetrates through the two transitions into the silicon can be registered by the photodetector. Incident light that is reflected by either transition will not be registered by the photodetector and cannot be measured. By reducing reflection, the sensitivity and the accuracy of the photodetector site will be increased.

Later Lord Rayleigh proposed a coating that has a gradual transition in the index of refraction from that of a material on one side of the coating to that of the material on the other side of the coating. This coating theoretically has no reflection because there is no optical discontinuity or transition from one material to another. Fresnel's equations do not apply. Due to the difficulty of creating such a coating, most optical systems using multiple thin films, often referred to as multi-coating or MC.

The observation of moth eye structures reveals a different approach for an effective AR coating. Moths have a cornea with extremely low reflection. It is supposed that less reflection from the eyes makes a moth harder for other creatures to see while improving night time vision. Electron microscopy reveals that there are arrays of pillar-like protuberances on the corneal surface of each ommatidia or receptor of a moth's compound eye. These arrays have sub-wavelength (SW) heights. Each pillar is about 100 nm in diameter and about 200 nm apart from each other pillar.

This structured surface with features that are smaller than the wavelength of the light of interest and a pattern repeat period smaller than the wavelength of the light of interest shows an anti-reflection property over a wide spectral bandwidth and a large field of view, i.e. a wide range of incident ray angles. The antireflection properties are improved by a decreased grating period, or distance between features, and increased grating depth, or increased feature height. The array of pillars behaves similarly in theory to a gradient gradually changing index layer with the effective refractive index determined by the filling factor of the grating and the groove mediums.

A sub-wavelength anti-reflection grating (SWAG) structure, may be instrumented with different dimensions for the height, t, of the features and the spacing, l, between features. For at least some feature shapes and configurations, excellent AR properties are provided with $t > 0.4\lambda$ and $l < \lambda/(2n_S)$. For light in a NIR wavelength range of at least 800 nm, these parameters suggest that the features should have $t \geq 320$ nm and $l \leq 40$ nm.

Figure 2:
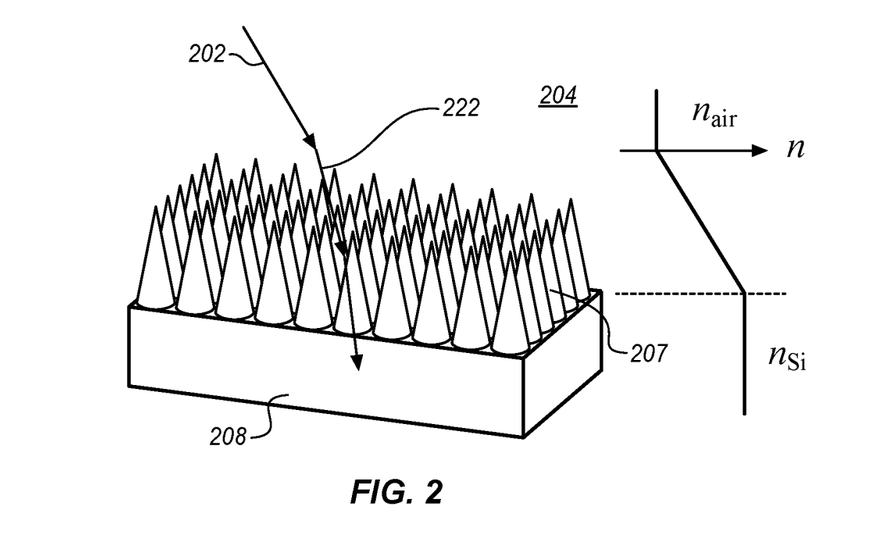
FIG. 2 is a diagram of a silicon block with an anti-reflection coating according to an embodiment.

FIG. 2 is a diagram of an alternative silicon block with a pillar array as an AR coating. As in FIG. 1, an incident ray 202 is propagating through air and an array of cones or cone-shaped pillars. There may optionally be additional thin films before or after the pillars such as a collimating or focusing lens, or a color filter, etc. The array 207 of cone shaped pillars gradually transition the index of refraction from that of the ambient, e.g. air, to that of the silicon 208. The transmitted light 222 then is transitioned so that there is no transition to the silicon. There is accordingly no reflection at the interface between the array 207 and the silicon.

The diagram on the right shows a first index diagram for the air $n_{air}$. The silicon block has another index of refraction $n_{Si}$ and the thin film has still another index of refraction $n_{film}$ which is between the two. However, in this example there is a gradual transition through the array of cones from $n_{film}$ to $n_{Si}$. Due to this gradual transition, there is only no reflective surface. Any optional thin film may have its own AR coating or array of cones. In some embodiments the array of cones is in air.

Figure 3:
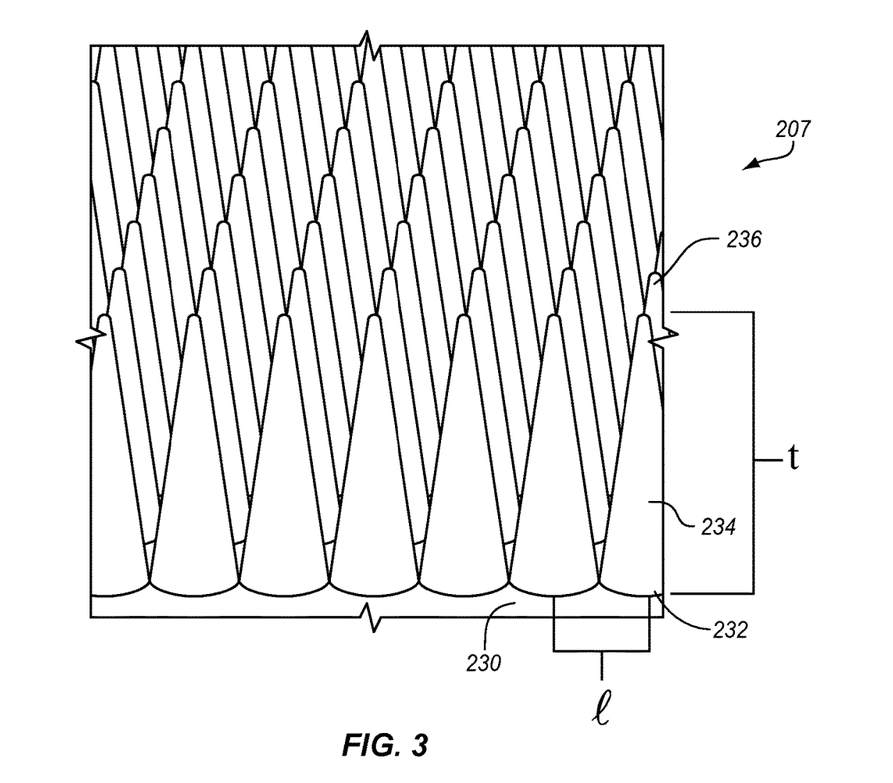
FIG. 3 is a diagram of an array of cones suitable for an anti-reflection coating according to an embodiment.

FIG. 3 is a diagram 207 of the array of cones in more detail. Each cone has a base 232 attached to a substrate 230 such as the top of the photodetector. A conical wall 234 extends from the base 232 to a narrower tip 236. The distance from the base to the tip is the height, t, mentioned above. The cones are arrayed in a roughly symmetrical set of parallel rows and columns and the distance from one cone to the next in either direction is the spacing, l, mentioned above.

Figure 4:
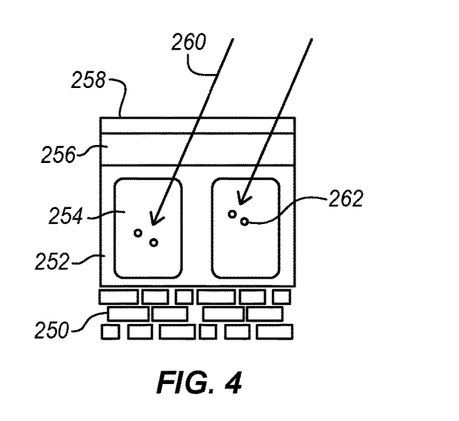
FIG. 4 is a simplified cross-sectional side view diagram of a portion of an image sensor array according to an embodiment.

FIG. 4 is a simplified cross-sectional diagram of two pixels of an image sensor array placed side-by-side. These pixels are part of a back-side illuminated array, however, embodiments are not so limited. The pixels are formed over a substrate 250 that includes wiring layers for power, exposure control, and any other desired functions. Each pixel is formed in an n-well 254 of a p-substrate 252 that is applied over the back side of the wiring layer silicon substrate 250. The n-well is the active photodiode that converts photons to electrons. A typically p+ surface passivation layer 256 is applied over the photodiodes and an AR coating 258 is applied over the passivation layer. This top AR coating may be formed of the sub wavelength surface features, such as the array of cones described above.

As shown incident light 260 strikes the AR coating and penetrates through the surface passivation and the p-substrate to the n-well. The photons of the incident light are then converted to free electrons 262 which can be measured in the circuitry of the wiring layers 250. This diagram shows an application of the AR coating described herein to an image array. The coating, based on an array of cones, may be applied to many other types and configurations of photodetectors. A benefit of the present AR coating is that the cones are on the order of a few hundred nm and spacing on the order of a few tens of nm. As pixels 254 become smaller and smaller even than 2.0 μm, these surface features still have sufficient space to be effective.

Figure 5:
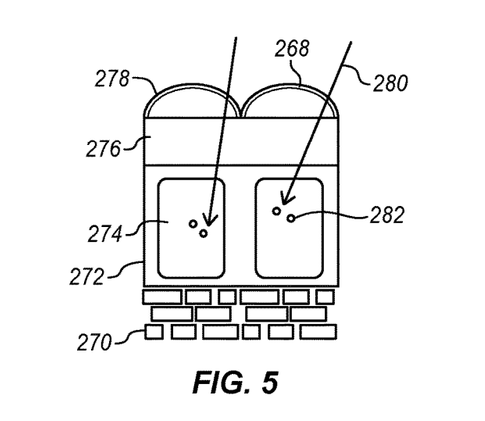
FIG. 5 is a simplified cross sectional side view diagram of a portion of an alternative image sensor array according to an embodiment.

FIG. 5 is a similar cross-sectional diagram of two pixels of a different image sensor array. As in FIG. 4, a p-substrate 272 is formed over the backside of a silicon substrate 270 that includes wiring layers. N-wells 274 are formed in the p-substrate to form photodiodes. The wells are covered with a passivation layer 276 for electrical isolation. In this example, each photodetector is covered with one or more micro-lenses 278. The micro-lens may be to concentrate light on the respective n-well, to filter out particular wavelengths such as with a color filter, and for any other desired purpose. In this case an array of cones may be applied to the surface of the micro-lens as an AR coating 268. As shown an array of sub-wavelength features, such as cones is formed over each respective micro-lens. Accordingly, the incident rays 280 are almost completely transmitted and enter the n-well to produce electrons 282.

Shallow surface gratings may be readily produced on silicon surfaces by directly irradiating the silicon using laser pulses. These are referred to as laser-induced periodic surface structures.

Another approach is to use copolymer self-assembly. Block copolymer self-assembly may be used together with silicon plasma etching to fabricate highly regular silicon surface nanotextures. These processes provide a possibility of precise control over the texture's lateral feature size in the range of 10-100 nm, both in vertical profile and feature density.

Figure 6:
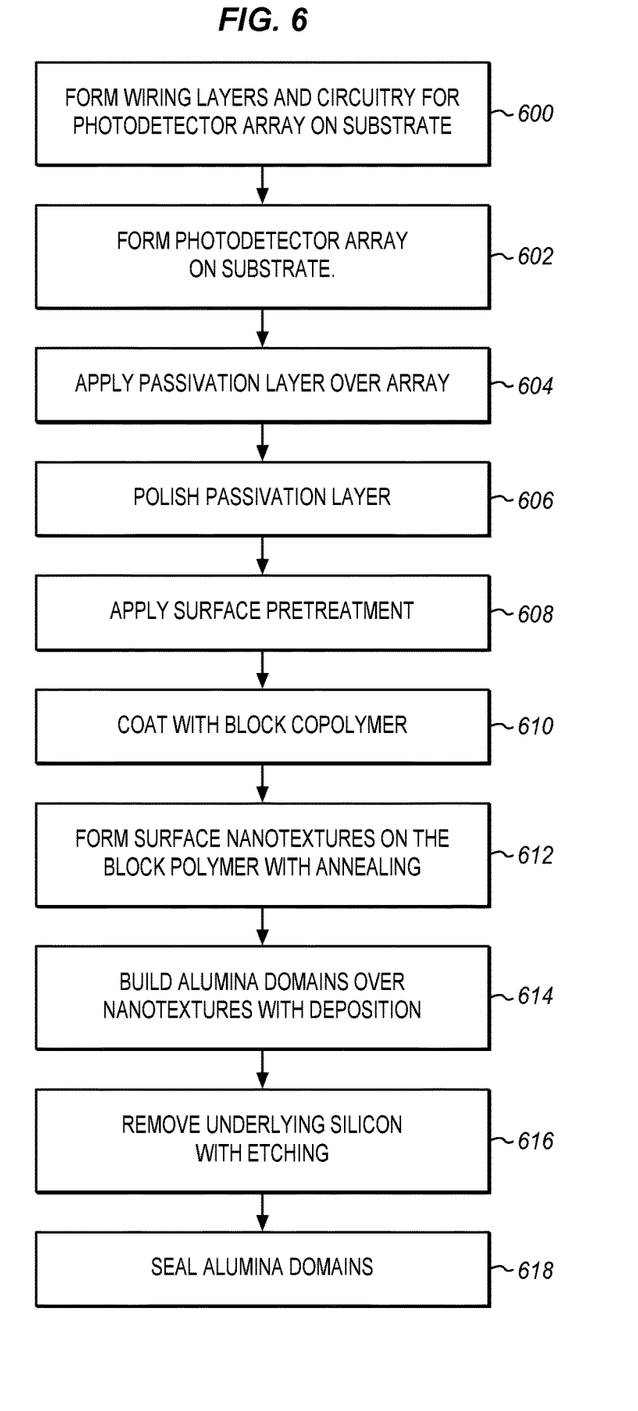
FIG. 6 is a process flow diagram of fabricating an image sensor array with reduced reflection according to an embodiment.

FIG. 6 is a process flow diagram of forming a photodetector array with reduced reflections. At 600 wiring layers and circuitry are formed on a substrate to support a photodetector array. At 610 a photodetector array is formed on the substrate. For a back side illuminated array, the circuitry is formed on the front side of the substrate, then the photodetectors are formed on the back side of the substrate. For other types of arrays all of the components may be formed on the same side.

At 606 the silicon surface such as a passivation layer over the array of photosites is first polished. At 608 a surface pretreatment is then applied. The surface pretreatment is designed to facilitate the perpendicular orientation of uniformly sized 20-30 nm diameter PMMA cylindrical micro domains within the PS (polystyrene) matrix that is to be formed. The micro-domains are then locally hexagonally arranged with a separation of about 40-60 nm.

Any of a variety of different pretreatments may be used. In some embodiments, a crosslinked or covalently bonded, insoluble layer is applied. This layer is derived from a random copolymer made from the same monomers as the Block Copolymer (BCP). The application may be done by surface functionalization through the grafting of a PS-r-PMMA random copolymer brush.

Surface nanotextures are formed on the polished pretreated silicon by first self-assembling a cylindrical phase PS-b-PMMA (polystyrene-b-poly(methyl methacrylate)) block copolymer thin film. At 610 the block copolymer thin film may be formed by spin-coating and then at 612 by thermal annealing at a medium temperature such as 200-300° C. The periodicity of the nanocylinders may be changed by changing the total molecular weight of the PS-b-PMMA from 50 to 200 kg/mol, for example. However, the invention is not so limited.

Then, at 614 alumina domains are built over the nanocylinders. The assembled copolymer film may be exposed to 5-10 sequential cycles of tri (methyl aluminum) and water vapor selectively. This may be done in any of a variety of different ways such as atomic layer deposition (ALD). This exposure loads the PMMA micro domains with alumina by sequential infiltration synthesis. The self-assembled alumina pattern provides a rugged template for creating surface nanotextures using silicon plasma etching.

At 616 the underlying silicon is then anisotropically etched by inductively coupled plasma-reactive ion etching using a gas chemistry of hydrogen bromide, chlorine and oxygen, which may produce a sidewall angle of greater than 70° from the horizontal polished surface. The gas mixture and etch parameters control the nanotexture profile, with the height of the cylinders, t, increasing with etch time. As the structures become taller, then the nanotextures taper more so that they are smaller at the top to form a tip as shown in FIG. 3.

The structures may then be optionally covered or sealed at 618. These nanotextures improve the quantum efficiency for NIR wavelengths in Si based sensors. The structures as described are compatible with pixels that are under 2.0 µm. As a result, smaller, lower power sensors may be constructed for biometric and depth sensing applications, among others. The particular dimensions are suitable for NIR and visible light with an image sensor near or less than 2.0 µm. However, other dimensions may be used to better suit other wavelengths and other types of image sensors.

This sub-wavelength array of pointed cylinders behaves as a gradient index layer. The effective refractive index is determined by the filling factor of the grating and the groove mediums. Fresnel reflection can be virtually eliminated because the incident ray does not traverse any significant optical discontinuity.

Figure 7:
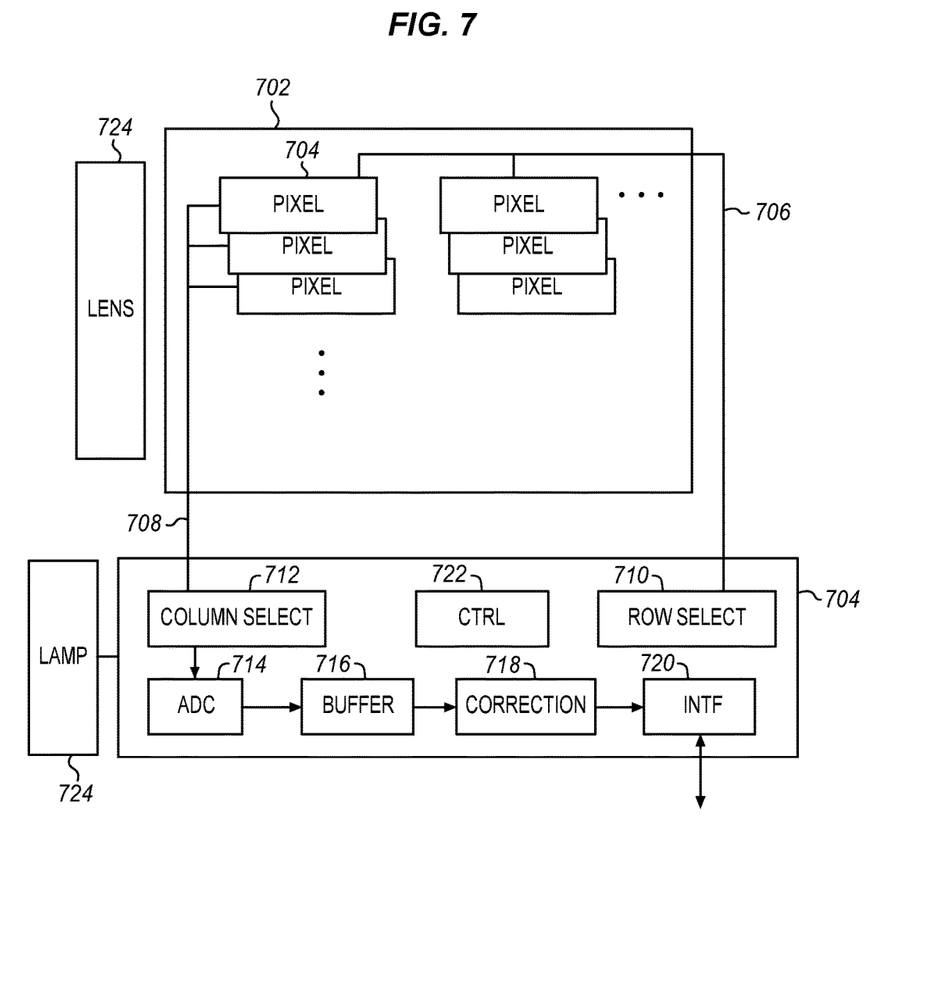
FIG. 7 is a block diagram of an image sensor with multiple photodetectors and depth sensing according to an embodiment.

FIG. 7 is a block diagram of an image sensor or camera system 700 that may include pixel circuits with anti-reflective properties as described herein. The camera 700 includes an image sensor 702 with pixels typically arranged in rows and columns. Each pixel may have a micro-lens with sub-wavelength features before each photodetector as described above. Each pixel is coupled to a row line 706 and a column line 708. These are applied to the image processor 704.

The image processor has a row selector 710 and a column selector 712. The voltage on the column line is fed to an ADC (Analog to Digital Converter) 714 which may include sample and hold circuits and other types of buffers. Alternatively, multiple ADC's may be connected to column lines in any ratio optimizing ADC speed and die area. The ADC values are fed to a buffer 716, which holds the values for each exposure to apply to a correction processor 718. This processor may compensate for any artifacts or design constraints of the image sensor or any other aspect of the system. The complete image is then compiled and rendered and may be sent to an interface 720 for transfer to external components.

The image processor 704 may be regulated by a controller 722 and contain many other sensors and components. It may perform many more operations than those mentioned or another processor may be coupled to the camera or to multiple cameras for additional processing. The controller may also be coupled to a lens system 724. The lens system serves to focus a scene onto the sensor and the controller may adjust focus distance, focal length, aperture and any other settings of the lens system, depending on the particular implementation. For stereo depth imaging using disparity a second lens 724 and image sensor 702 may be used. This may be coupled to the same image processor 704 or to its own second image processor depending on the particular implementation.

The controller may also be coupled to a lamp or projector 724. This may be an LED in the visible or infrared range, a Xenon flash, or another illumination source, depending on the particular application for which the lamp is being used. The controller coordinates the lamp with the exposure times to achieve different exposure levels described above and for other purposes. The lamp may produce a structured, coded, or plain illumination field. There may be multiple lamps to produce different illuminations in different fields of view.

Figure 8:
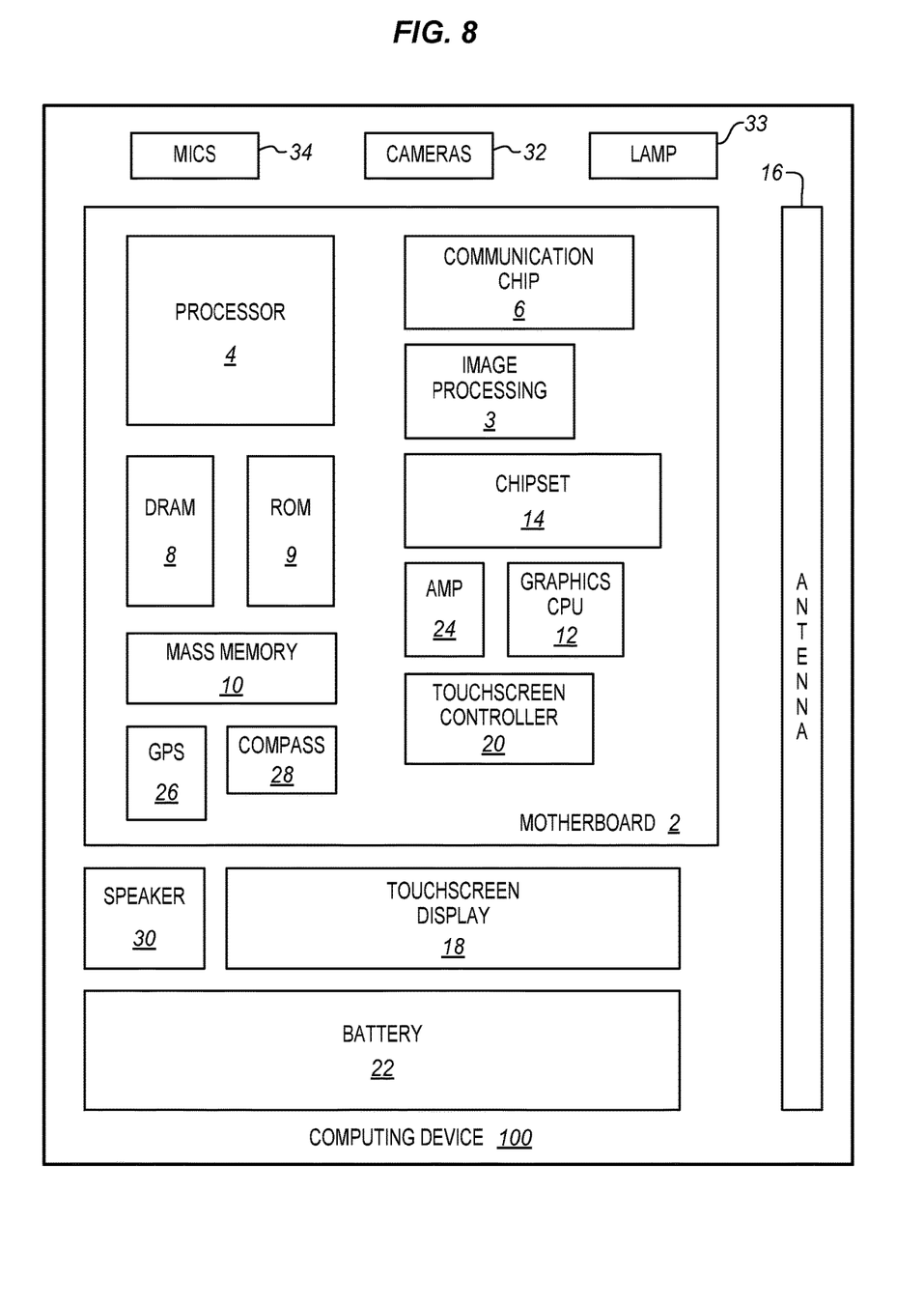
FIG. 8 is a block diagram of a computing device incorporating depth sensing and high dynamic range according to an embodiment

FIG. 9 is a block diagram of a computing device 100 in accordance with one implementation. The computing device 100 houses a system board 2. The board 2 may include a number of components, including but not limited to a processor 4 and at least one communication package 6. The communication package is coupled to one or more antennas 16. The processor 4 is physically and electrically coupled to the board 2.

Depending on its applications, computing device 100 may include other components that may or may not be physically and electrically coupled to the board 2. These other components include, but are not limited to, volatile memory (e.g., DRAM) 8, non-volatile memory (e.g., ROM) 9, flash memory (not shown), a graphics processor 12, a digital signal processor (not shown), a crypto processor (not shown), a chipset 14, an antenna 16, a display 18 such as a touchscreen display, a touchscreen controller 20, a battery 22, an audio codec (not shown), a video codec (not shown), a power amplifier 24, a global positioning system (GPS) device 26, a compass 28, an accelerometer (not shown), a gyroscope (not shown), a speaker 30, a camera 32, a lamp 33, a microphone array 34, and a mass storage device (such as a hard disk drive) 10, compact disk (CD) (not shown), digital versatile disk (DVD) (not shown), and so forth). These components may be connected to the system board 2, mounted to the system board, or combined with any of the other components.

The communication package 6 enables wireless and/or wired communications for the transfer of data to and from the computing device 100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication package 6 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 100 may include a plurality of communication packages 6. For instance, a first communication package 6 may be dedicated to shorter range wireless communications such as Wi-Fi and Bluetooth and a second communication package 6 may be dedicated to longer range wireless communications such as GPS, EDGE, GPRS, CDMA, WiMAX, LTE, Ev-DO, and others.

The cameras 32 contain image sensors with pixels or photodetectors as described herein. The image sensors may use the resources of an image processing chip 3 to read values and also to perform exposure control, depth map determination, format conversion, coding and decoding, noise reduction and 3D mapping, etc. The processor 4 is coupled to the image processing chip to drive the processes, set parameters, etc.

In various implementations, the computing device 100 may be eyewear, a laptop, a netbook, a notebook, an ultrabook, a smartphone, a tablet, a personal digital assistant (PDA), an ultra mobile PC, a mobile phone, a desktop computer, a server, a set-top box, an entertainment control unit, a digital camera, a portable music player, a digital video recorder, wearables or drones. The computing device may be fixed, portable, or wearable. In further implementations, the computing device 100 may be any other electronic device that processes data.

Embodiments may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

References to "one embodiment", "an embodiment", "example embodiment", "various embodiments", etc., indicate that the embodiment(s) so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to an image sensor that includes a plurality of photodetectors on a silicon substrate and having a top surface, and an anti-reflective coating over the photodetectors, the coating having an array of sub-wavelength sized features.

In further embodiments the features are cones extending from the top surface.

Further embodiments include a micro-lens over each photodetector and the array of sub-wavelength sized features is over each respective micro-lens.

In further embodiments the cones have a height of more than about 0.4 times the longest wavelength of light that is to be passed through the coating.

In further embodiments the cones have a spacing of less than about one half the longest wavelength of light that is to be passed through the coating.

In further embodiments the cones are smaller than a wavelength of light to be received at the photodetectors and have a pattern repeat smaller than a wavelength of light to be received at the photodetectors.

In further embodiments the features are formed of alumina.

In further embodiments the features have a graded index of refraction transition from an ambient index of refraction to an index of refraction of the photodetectors.

In further embodiments the features are formed over the top surface.

In further embodiments each feature has a base attached to the top surface, a conical surface that extends from the base and a tip opposite the base and narrower than the base.

In further embodiments the features are arrayed in parallel rows and columns.

Some embodiments pertain to a method that includes forming an array of pixels on a silicon substrate and forming sub-wavelength features on the silicon as an anti-reflection coating over the silicon of the substrate.

In further embodiments the sub-wavelength features are an array of cones.

Further embodiments include applying a passivation layer over the substrate and polishing the passivation layer before forming the sub-wavelength features.

Further embodiments include applying a pretreatment to the passivation layer, applying a block copolymer thin film over the passivation layer, and annealing the thin film.

Further embodiments include loading the block copolymer with alumina and then etching away the block copolymer to leave an array of cones.

In further embodiments the sub-wavelength features are smaller and have a pattern repeat smaller than a wavelength of light to be received at the photodetectors.

Some embodiments pertain to a system that includes a communications chip to send images to external devices, a processor coupled to the communications chip to send images to the communications chip, and an image sensor coupled to the image processor to send captured image data to the image processor, the image sensor having a plurality of photodetectors on a silicon substrate and having a top surface, and an anti-reflective coating over the photodetectors, the coating having an array of sub-wavelength sized cones.

In further embodiments the image sensor further comprises a micro-lens over each photodetectors to direct light to the photodetectors and wherein the sub-wavelength sized cones are over the micro-lenses.

In further embodiments the cones comprise alumina loaded into a block copolymer that has been etched away.

The invention claimed is:

1. An image sensor comprising:
   a plurality of photodetectors on a silicon substrate and having a top surface;
   an anti-reflective coating on the top surface over the photodetectors, the anti-reflective coating having an array of sub-wavelength sized features, wherein each of the sub-wavelength sized features comprises self-assembling block copolymer micro domains of a self-assembling block copolymer thin film that comprises alumina to provide a self-assembled alumina pattern over the photodetectors; and
   wherein the sub-wavelength sized features comprise cones extending from the top surface.

2. The apparatus of claim 1, wherein the self-assembling block copolymer thin film is a self-assembling cylindrical phase block copolymer thin film, wherein each of the cones comprises the alumina domains including the alumina that is built over nanocylinders of the self-assembling cylindrical phase block copolymer thin film.

3. The apparatus of claim 2, wherein the cones have a height of more than about 0.4 times the longest wavelength of light that is to be passed through the coating.

4. The apparatus of claim 2, wherein the cones have a spacing of less than about one half the longest wavelength of light that is to be passed through the coating.

5. The apparatus of claim 2, wherein the cones are smaller than a wavelength of light to be received at the photodetectors and have a pattern repeat smaller than a wavelength of light to be received at the photodetectors.

6. The apparatus of claim 1, further comprising a micro-lens over each photodetector and wherein the array of sub-wavelength sized features is over each respective micro-lens.

7. The apparatus of claim 1, wherein the self-assembling block copolymer thin film is made from monomers, the apparatus further comprising:
   a polished passivation layer over the top surface; and
   a cross-linked pre-treatment layer made of the same monomers as the self-assembling block copolymer thin film.

8. The apparatus of claim 1, wherein the features have a graded index of refraction transition from an ambient index of refraction to an index of refraction of the photodetectors.

9. The apparatus of claim 1, further comprising micro-lenses over the photodetectors, the top surface being over the micro-lenses and wherein the features are formed over the top surface.

10. The apparatus of claim 1, wherein each feature has a base attached to the top surface, a conical surface that extends from the base and a tip opposite the base and narrower than the base.

11. The apparatus of claim 10 wherein the features are arrayed in parallel rows and columns.

12. A method comprising:
    forming an array of photodetector pixels on a silicon substrate;
    applying a thin film of a self-assembling block copolymer over the pixels;
    etching the thin film to form sub-wavelength features on the silicon as an anti-reflection coating over the silicon of the substrate, wherein each of the sub-wavelength sized features comprises self-assembling block copolymer micro domains of the self-assembling block copolymer thin film that comprises alumina to provide a self-assembled alumina pattern; and
    wherein the sub-wavelength features comprise an array of cones.

13. The method of claim 12, wherein the self-assembling block copolymer is a self-assembling cylindrical phase block copolymer thin film, the method further comprising loading the self-assembling block copolymer micro domains with the alumina and wherein etching comprises anisotropically etching the alumina domains and the thin film using inductively coupled plasma-reactive ion etching.

14. The method of claim 12, further comprising applying a passivation layer over the substrate and polishing the passivation layer before applying the thin film.

15. The method of claim 14, wherein the self-assembling block copolymer thin film is made from monomers, the method further comprising:
    applying a cross-linked pretreatment layer made of the same monomers as the self-assembling block copolymer thin film to the passivation layer;
    and
    annealing the self-assembling block copolymer thin film so that the self-assembling block copolymer thin film self assembles nanocylinders and wherein building the alumina domains comprises building the alumina domains over the self-assembled nanocylinders.

16. The method of claim 15, wherein building alumina domains comprises loading the block copolymer thin film with alumina by exposing the self-assembling block copolymer thin film to sequential infiltration synthesis and wherein anisotropically etching comprises etching the block copolymer thin film to leave an array of cones.

17. The method of claim 12, wherein the sub-wavelength features have a pattern repeat smaller than a wavelength of light to be received at the photodetectors.

18. A system comprising:
a communications chip to send images to external devices;
a processor coupled to the communications chip to send images to the communications chip; and
an image sensor coupled to the image processor to send captured image data to the image processor, the image sensor having a plurality of photodetectors on a silicon substrate and having a top surface, and an anti-reflective coating over the photodetectors, the anti-reflective coating having an array of sub-wavelength sized cones, wherein each of the sub-wavelength sized cones comprises nanocylinders of a self-assembling cylindrical phase block copolymer thin film that comprises alumina to provide a self-assembled alumina pattern.

19. The system of claim 18, wherein the image sensor further comprises a micro-lens over each photodetector to direct light to the photodetectors and wherein the sub-wavelength sized cones are over the micro-lenses.

20. The system of claim 18, wherein the cones comprise the alumina loaded into the block copolymer by atomic layer deposition that has been etched to form the cones.

* * * * *